(12) United States Patent
Horiguchi

(10) Patent No.: US 9,299,961 B2
(45) Date of Patent: Mar. 29, 2016

(54) OLED DISPLAY PANEL

(71) Applicant: Japan Display Inc., Tokyo (JP)

(72) Inventor: Kaoru Horiguchi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/824,899

(22) Filed: Aug. 12, 2015

(65) Prior Publication Data

US 2015/0349297 A1  Dec. 3, 2015

Related U.S. Application Data

(62) Division of application No. 14/495,945, filed on Sep. 25, 2014, now Pat. No. 9,147,857.

(30) Foreign Application Priority Data

Sep. 25, 2013  (JP) ................................. 2013-198158

(51) Int. Cl.
*H01L 21/00* (2006.01)
*H01L 51/56* (2006.01)

(52) U.S. Cl.
CPC ........... *H01L 51/56* (2013.01); *H01L 2227/323* (2013.01)

(58) Field of Classification Search
CPC ... H01L 51/50; H01L 51/525; H01L 2227/32; H01L 2227/326

USPC ...................................................... 438/22, 28
See application file for complete search history.

(56) References Cited

U.S. PATENT DOCUMENTS

| 2003/0064171 | A1  | 4/2003 | Burrows et al. |
| 2003/0094615 | A1* | 5/2003 | Yamazaki ............... H01L 27/12 257/72 |
| 2015/0069338 | A1  | 3/2015 | Cho et al. |

FOREIGN PATENT DOCUMENTS

JP  2005-504652 A  2/2005

* cited by examiner

*Primary Examiner* — Hoai V Pham
(74) *Attorney, Agent, or Firm* — Typha IP LLC

(57) ABSTRACT

An OLED display panel and manufacturing method of the panel are provided in which a terminal electrode is exposed by performing etching with fixed etching conditions without performing step processing. A terminal region comprised from a plurality of metal electrodes 2 conducting with an organic light emitting element of a display part is formed above a substrate 1. Next, a stacked sealing film comprised from a first Si contained inorganic layer, an organic resin layer and a second Si contained inorganic layer is formed above a surface of the display part and the terminal region 6. Next, etching is performed using etching conditions suitable for the first and the second Si contained inorganic layer while the display part is masked, the first and the second Si contained inorganic layer above the metal electrode 2 are removed and a surface of the metal electrode 2 is exposed.

1 Claim, 4 Drawing Sheets

OLED DISPLAY PANEL

CROSS REFERENCE TO RELATED APPLICATIONS

This application is a divisional application of U.S. Pat. application Ser. No. 14/495,945, filed on Sep. 25, 2014, which claims the benefit of priority from Japanese Patent Application No. 2013-198158, filed on Sep. 25, 2013, in the Japanese Patent Office, the entire contents of which are incorporated herein by reference.

FIELD

The present invention is related to an OLED display panel in which a terminal group supplied with an image signal or drive signal is formed above a part of a substrate and a plurality of OLED (Organic Light-Emitting Diodes) for displaying an image are formed in a matrix above the substrate.

BACKGROUND

An OLED panel is formed form a display part comprised from a plurality of OLED (Organic Light-Emitting Diodes) arranged in a matrix for display an image, a circuit such as a driver for selectively driving each OLED which forms the display part, and a terminal comprised from a plurality of terminal electrodes connected to a flexible blueprint circuit substrate (referred to below as [FPC substrate]) for supplying an image signal and a drive power to a driver from the exterior. The display part, circuit such as the driver and terminal are formed above a substrate made from glass or ceramics.

In this type of OLED display panel, it is necessary to form a stacked sealing film above the display part in order to improve weather resistance of an organic light emitting layer which forms an OLED and secure reliability. This stacked sealing layer is formed from three layers, a SiN film, organic resin film, and SiN Film in order from the OLED side or from four layers, a SiN film, SiO film, organic resin film and SiN film (for example, refer to Japanese Laid Open Patent 2005-504652). When foreign bodies are attached to the top of a bank which separates OLED's or on the OLED itself, what is called a stepwise break is often produced so that SiN does not wrap up to a part which becomes a shadow of foreign objects when forming a SiN film. In this case, adopting a film structure in which an organic resin film is sandwiched by a SiN film, because the organic resin is formed with a smooth surface shape and envelopes foreign objects, a stepwise break of a SiN formed above thereon is prevented.

The stacked sealing film conventionally is sufficient if it is formed only above a display apart. However, in order to simplify the film formation process as well as secure the effects of sealing, it is preferred that the stacked sealing film is once formed across the entire surface of the OLED display panel. In this case, because a terminal electrode must be exposed in order to be electrically connected with a FPC substrate, after forming a stacked sealing film, it is necessary to remove the part of the stacked sealing film formed above a terminal by etching etc.

However, the stacked sealing film described above includes a SiN film and an organic resin film. Since the etching conditions such as the type of process gas used for etching between a SiN film and organic resin film are different, in order to securely remove the stacked sealing film from above a terminal, what is called step processing must be carried out which is a process for switching the etching conditions for each film to be etched. When this step processing is carried out, the process time is increased and it becomes necessary to use more complex etching apparatus. Therefore, yield is reduced and the cost is increased.

Therefore, the present invention attempts to provide an OLED display panel and manufacturing method of the panel in which a terminal electrode is exposed by performing etching with fixed etching conditions without performing step processing.

SUMMARY

An OLED display panel according to the present invention includes a substrate, a display part including a plurality of organic light emitting elements formed above the substrate, a plurality of electrodes formed in a band shape above the substrate and each capable of conducting with an electrode above another substrate respectively, and a stacked sealing film formed above the display part and including a first Si contained inorganic layer, an organic resin layer and a second Si contained inorganic layer in sequence from the substrate side, wherein the first Si contained inorganic layer and the organic resin layer are formed between the plurality of electrodes.

A manufacturing method of an OLED display panel according to the present invention includes forming a display part including a plurality of organic light emitting elements above a substrate, forming a plurality of electrodes in a band shape above the substrate, each capable of conducting with an electrode above another substrate, forming a stacked sealing film including a first contained inorganic layer, an organic resin layer and a second contained inorganic layer in sequence from the substrate side above the display part and the plurality of electrodes, and exposing a surface of the plurality of electrodes by performing etching using etching conditions suitable for the first Si contained inorganic layer and the second Si contained inorganic layer while the display part is masked.

DESCRIPTION OF EMBODIMENTS

The embodiments of an OLED display panel according to the present invention are explained below based on the drawings.

[First Embodiment]

First, a process where it is possible to expose a terminal electrode by performing etching using fixed etching conditions without performing step processing using the present embodiment is explained. As a result of keen research by the inventors, a film thickness distribution is generated in an acryl resin without forming a uniform film when there are uneven parts on a base coated with the resin. As a result, it was determined that it is difficult to form the acryl resin on a flat section and that there is a tendency for the resin to form a film by agglomerating exclusively in recessed parts. This tendency is assumed to be caused by the influence of the environment which promotes molecular bonding of the acryl resin being significantly different between recess parts and flat parts. A similar tendency is also confirmed with polyimide and phenol resin.

Therefore, in the present embodiment, an acryl resin film is used as an organic resin film sandwiched between SI contained inorganic films. The upper surface of each terminal electrode which forms a terminal is flat and both sides form a recess part. As a result, it is difficult to form the acryl film on an upper surface of each terminal and an acryl film coated on a terminal flows into a recess part between terminal electrodes form the surface of the terminal electrode and agglomerates within the recess part. As a result, it is possible to expose the surface of each terminal electrode by etching using etching conditions for the Si contained inorganic film.

Figure 1:
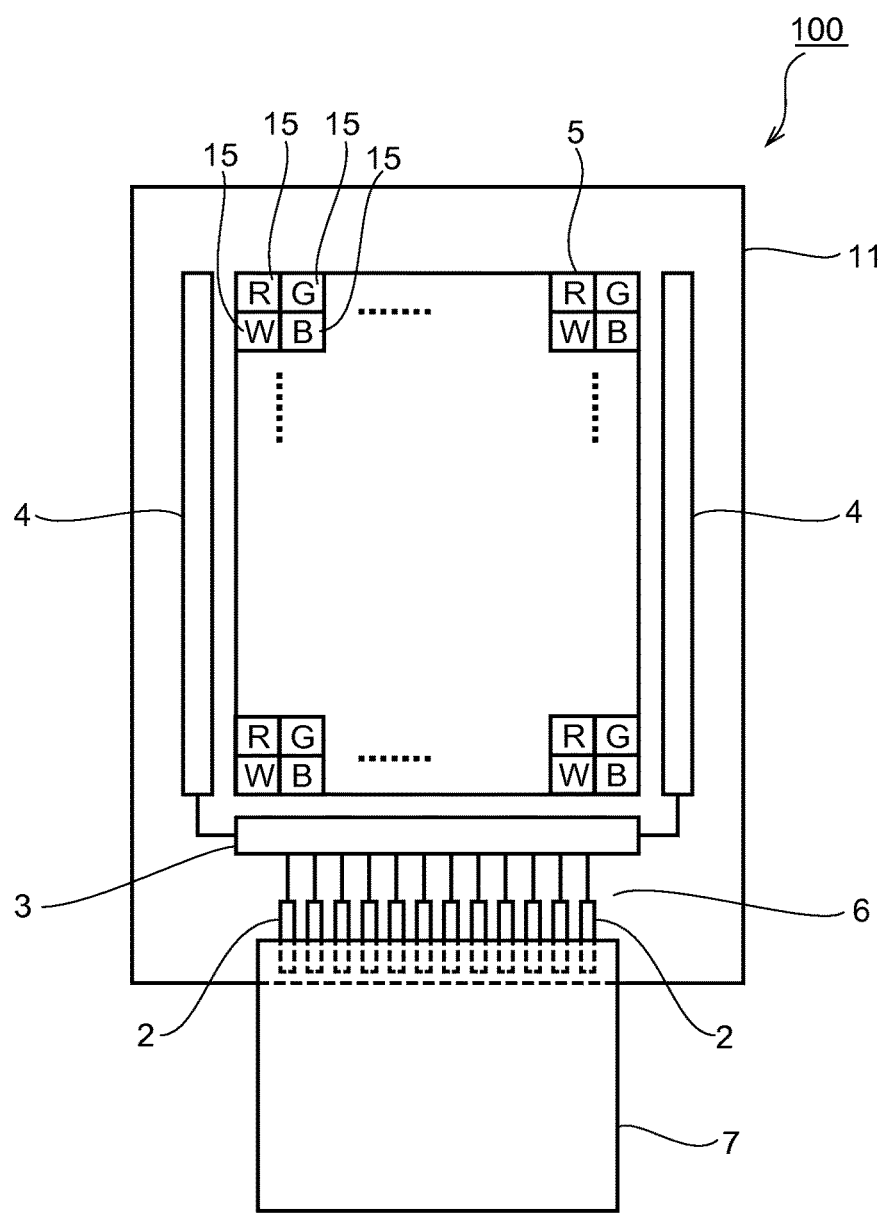
FIG. 1 is a planar view diagram of an OLED display panel according to a first embodiment.
Figure 2:
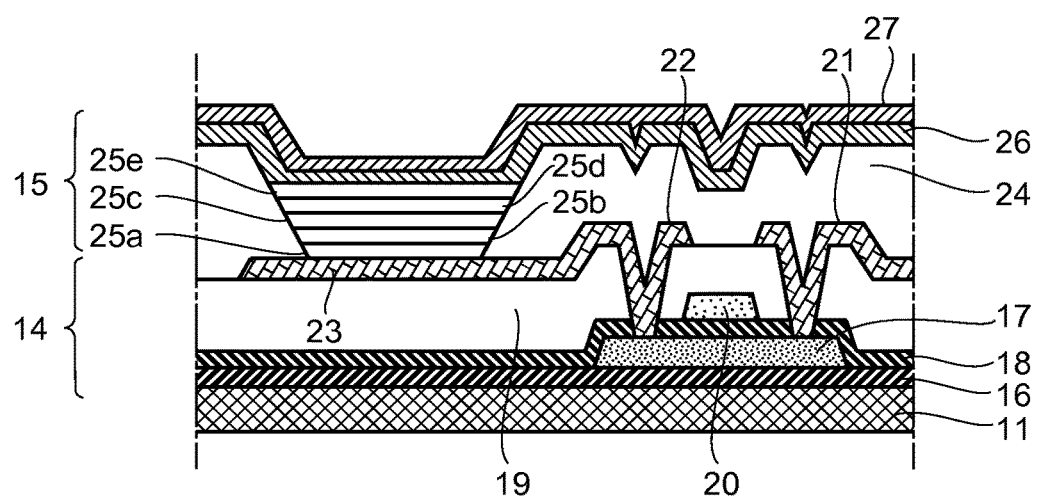
FIG. 2 is a partial expanded cross-sectional diagram of each OLED of a display part.
Figure 3:
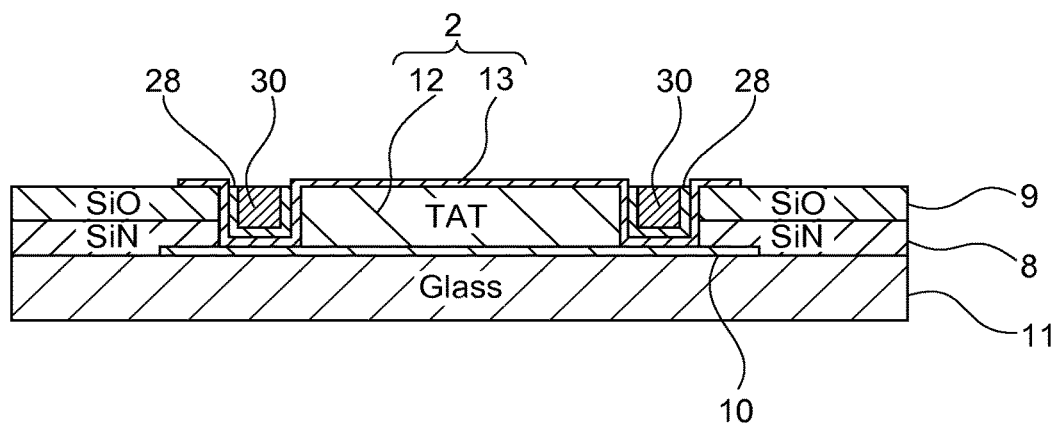
FIG. 3 is a partial expanded vertical cross-sectional diagram of a terminal region.

Next, the structure of the OLED display panel according to the present embodiment is explained based on FIG. 1 to FIG. 3. FIG. 1 is a planar view diagram of an OLED display panel 100 according to the present embodiment. FIG. 2 is an expanded partial vertical cross-sectional diagram near each OLED which form a display part 5 of the OLED display panel 100. FIG. 3 is an expanded partial vertical cross-sectional diagram near each terminal electrode 2 of the OLED display panel 100.

As is shown in FIG. 1, in a planar view, a plurality of groups of four OLED's 15 which display one color pixel by emitting three prime colors (red, green, blue) and white are arranged in a matrix shape at the center of the OLED display panel 100. These OLED's 15 are formed with a display area 5 which display an image by selectively adjusting an amount of emitted light and being driven. In addition, driving circuits (X driver, Y driver shifter register etc) 3, 4 for selectively adjusting an amount of emitted light and driving each OLED 15 within the display area 5 are arranged at three locations in a periphery region of the display area 5 on an upper surface of the OLED display panel 100.

The display area 5 and each driving circuit 3, 4 are formed above a single glass substrate 11. In addition, as is shown in the expanded partial vertical cross-sectional view in FIG. 3, a plurality of wiring patterns 10 are formed by a polysilicon thin film in the vicinity of an edge near the driving circuit 3 in the glass substrate 11. The wiring pattern 10 conducts with each driving circuit and is arranged for connecting to ground as well as supplying a power supply voltage and a drive voltage to each driving circuit 3, 4. An end part of each wire is linked with metal electrode 2. The metal electrode 2 is formed in a strip shape in a length direction in a direction which intersects an edge near the glass substrate 11. In addition, each metal electrode 2 is formed as a terminal region 6 which is connected to a flexible print circuit substrate (FPC substrate) 7 which supplies drive power, a driving signal and an earth potential from the exterior by being arranged along the edge described above in the glass substrate 11. Furthermore, as is shown in the expanded partial vertical cross-sectional view in FIG. 3, each metal electrode 2 includes a structure in which an ITO (Indium Tin Oxide) film 13 is coated on a surface of a TAT (Titan Aluminum Titan) layer 12. The TAT layer 12 may be formed together when a source wire 21, drain wire 22 and anode 23 described below are formed. In addition, the ITO thin film 13 may be formed together when a transparent cathode 26 described below is formed. This is for improving conductivity between an electrode on the side of the FPC substrate 7 and the wiring pattern 10. In addition, a silicon nitride (SiN) layer 8 and silica (SiO) layer 9 which remain when a bank described below is produced are arranged between each metal electrode 2. Each metal electrode 2, silicon nitride (SiN) layer 8 and silica (SiO) layer 9 are separated and form a recess part. In addition, the wiring pattern 10 described above is exposed on the bottom of this recess part. The ITO thin film 13 described above is connected to the wiring pattern 10 exposed on the bottom of the recess part. Furthermore, the ITO thin film 13 reaches beyond the recess part and as far as the edge of the silicon nitride (SiN) layer 8 and silica (SiO) layer 9.

In addition, as is shown in FIG. 2, the display part is broadly comprised from a TFT (Thin Film Transistor) layer 14 and an OLED layer 15. The main structural components of the TFT layer 14 are a first insulation layer 16, semiconductor layer 17, second insulation layer 18, third insulation layer 19, gate wire (gate electrode) 20, a pair of wires (source wire 21, drain wire 22) and an anode 23. The first insulation layer 16 is formed on an upper surface of the glass substrate 11. The semiconductor layer 17 is patterned and formed above the insulation layer 16. The second insulation layer 18 is formed to cover the semiconductor layer 17. The gate wire 20 is formed above and below the semiconductor layer 17 sandwiching the second insulation layer 18. The third insulation layer 19 may be a planarized layer covering the gate wire 20. A pair of wires are patterned above the third insulation layer 19 and are connected to the semiconductor layer 17 via a contact hole formed in the third insulation layer 19. The anode 23 is formed in the drain wire 22 so as to have a shape corresponding to each pixel. The anode 23 may also be a reflection electrode. Furthermore, instead of the glass substrate 11, a ceramic, resin or metal substrate may be used or a flexible substrate.

The main structural components of the OLED 15 are a bank 24, an organic EL layer 25, a transparent cathode 26 and a stacked sealing film 27. The bank 24 is formed between adjacent pixels and while covering an end part of the anode 23, exposes parts other than this end part and define a light emitting region. The organic EL layer 25 is formed above the anode 23 and includes a similar shape to the anode 23. Furthermore, the organic EL layer 25 may be formed so as to cover the anode 23 and bank 24. The transparent cathode 26 is formed on an upper surface of the organic EL layer 25 and bank 24. The stacked sealing film 27 is formed so as to cover the transparent cathode 26. The organic EL layer 25 is a separated-function type and applies a stacked structure of a positive hole injection layer 25a, a positive hole transport layer 25b, a light emitting layer 25c, an electron transport layer 25d and an electron injection layer 25e in sequence from the anode 23 side. In addition, a field-effect transistor (gate wire (gate electrode), 20, semiconductor 17, source wire 21, drain wire 22) is driven according to a signal applied to the gate wire 20. In response to driving the field-effect transistor, holes supplied from the anode 23 and electrons supplied from the transparent cathode 27 each reach the light emitting layer 25c via the positive hole injection layer 25a and positive hole transport layer 25b and the electron injection layer 25e and electron transport layer 25d, and light is emitted when they recombine within the light emitting layer 25c.

Furthermore, although the stacked sealing film 27 actually includes a three layer structure comprised form a first SiN contained inorganic film, an acryl resin film and a second SiN contained inorganic film in this order form the side of the transparent cathode 26, only a single layer is depicted in FIG. 2 for the purposes of creating the diagrams. In addition, the stacked sealing film 27 covers the entire surface of the OLED display panel 100 including the formation parts of the display area 5 and formation parts of each driving circuit 2, 4 described above except the terminal region 6.

When the manufacturing process of the OLED display panel 100 formed as described above is explained, first, the TFT layer 14 is formed using a usual LPTS (Low Temperature Poly-Silicon) process. Although polysilicon is used as the material of the semiconductor 17 of the TFT layer 14, amorphous silicon may be used, an oxide semiconductor or an organic semiconductor may also be used. Furthermore, a polysilicon thin film as the wiring pattern described above is also formed in the formation location of the terminal region 6 by the formation process of the TFT layer 14.

Next, a bank which defines each light emitting region by covering an edge of the anode 23 separated for each light emitting region of each color of each pixel of the TFT layer 14 is formed by silicon nitride (SiN) and silica (SiO). That is, a silicon nitride (SiN) film and silica (SiO) film are formed on the entire surface of the glass substrate where the TFT layer 14 is formed. Following this, an aperture is arrange din a location corresponding to each light emitting region by etching these films, the anode 23 is exposed, the formation location of each metal electrode 2 of the terminal region 6 is opened and the wiring pattern 10 of the polysilicon thin film is exposed. Furthermore, an organic resin film may be used for the bank.

Next, an organic EL layer 25 is formed in each aperture corresponding to each light emitting region. It is possible to use high-molecular printing, an inkjet, laser transfer or deposition when forming the organic EL layer 25.

Next, the cathode 26 which supplies electrons to the organic EL layer 25 of each OLED 15 is formed from a single transparent electrode across an entire surface of the display area 5 which includes all organic EL layers 25 (electron injection layer 25e) and banks formed in each light emitting region.

Figure 4:
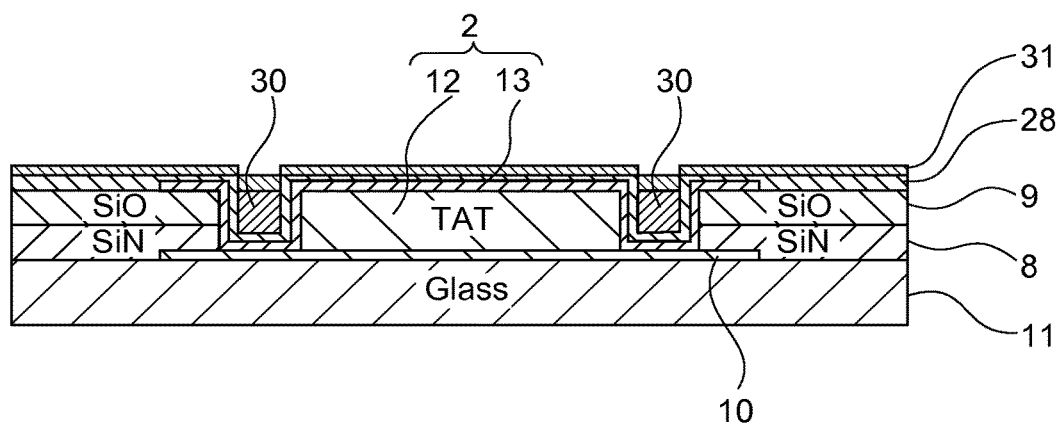
FIG. 4 is a partial expanded vertical cross-sectional diagram during a manufacturing process of a terminal region.

Next, in order to improve moisture resistance, prevent water permeation and improve the causes of obstacles to reliability such as DS (dark spots), the stacked sealing film 27 is arranged above the cathode 26 across the entire surface of the OLED panel including the display area 5 and terminal region 6. Specifically, the stacked sealing film 27 is formed from a total of three layers, the first Si contained inorganic film 28, an organic resin film 30 and a second Si contained inorganic film 31 in sequence from the side of the cathode. Although a SiN film which is an fine inorganic material film is used for each Si contained inorganic film 28, 31, a $SiO_2$ film or N contained SiO film may also be used. The thickness of the Si contained inorganic film 28, 31 is preferred to be 200-600 nm for example and the thickness of the organic resin film 30 is preferred to be 200-800 nm. For the reasons described above, acryl, polyimide or phenol resin is used as the organic resin film 30. As a result, the organic resin film 30 is formed so as to be buried in a recess part formed in the surface of the first Si contained inorganic film 28 formed according to the shape of a base but is not formed on a flat surface of the first Si contained inorganic film 28. Therefore, in the terminal region 6, the first Si contained inorganic film 28 is formed according to the shape of the surface of the metal electrode 2 and a stacked film (silicon nitride (SiN) film 8 and silica (SiO) film 9) and an inner surface of a the recess part, and a recess part in the first Si contained inorganic film 28, that is, a material of the organic resin film 30 agglomerates in the recess part formed between the metal electrode 2 and the stacked film (silicon nitride (SiN) film 8 and silica film (SiO) film 9) and the recess part becomes buried. Therefore, the surface of the organic resin film formed in the recess part and the exposed surface of the first Si contained inorganic film 28 become a single surface and above this, the second Si contained inorganic film 31 is formed almost flat. FIG. 4 shows this state.

Next, from this state, dry etching is performed once on the first SI contained inorganic film 28 and the second Si contained inorganic film 31 while parts other than the terminal region 6 are masked. Because gases such as $SF_6$ and $O_2$ are used in this etching and the etching conditions are suitable for an inorganic film, the organic resin film 30 remains unchanged without being etched. Then, with the organic resin film remaining, the entire surface area of the metal electrode 2 is exposed as is shown in FIG. 3, and at almost the same time, the surface of the SiO film 9 is also exposed. In the present embodiment, the OLED display panel is considered completed in this state, and when the OLED display panel is incorporated into a final product, an FPC substrate 7 overlaps the terminal region 6 and each metal electrode 2 of the terminal region 6 conducts with an electrode of the FPC substrate 7. At this time, any remaining organic resin film 30 and first Si contained inorganic film 28 covered by the organic resin film 30 does not negatively affect conduction of the terminals.

In this way, even in the case where a stacked sealing film including an organic resin film, first Si contained inorganic film and second Si contained inorganic film is adopted, the stacked resin film above an electrode is removed without performing a step processing by performing etching once according to etching conditions suitable for a first Si contained inorganic film and second Si contained inorganic film, and it is possible to expose an electrode surface.

According to the OLED display panel and manufacturing method of the panel of the present embodiment explained above, because an etching process of the organic resin film 30 and first Si contained inorganic film 28 of the parts covered by the organic resin film 30 is removed, as well as contributing to process simplification, full etching time of the organic resin film 30 which requires a long time due to a large film thickness distribution can be omitted and it is possible to realize a reduction takt time. For example, when the organic resin film 30 is formed to a thickness of 250 nm using acryl, the thickness of the organic resin film 30 which agglomerates in the recess parts between the metal electrode 2 and the stacked film (the silicon nitride (SiN) layer 8 and silica (SiO) layer 9) is about 800 nm. Therefore, if full etching is performed on the organic resin film 30, a takt time of about three times the time required for etching to 200 nm is required. Furthermore, if the first Si contained inorganic film 28 covered by the organic resin film 30 is removed by etching, coverage of the silicon nitride (SiN) layer 8 and silica (SiO) layer 9 by the ITO thin film 13 becomes poor, and a problem occurs whereby an etching gas side etches the silicon nitride (SiN) layer 8 and silica (SiO) layer 9. According to the present embodiment, because this side etching does not occur, there is fear of negative effects on reliability. As a result, because stable manufacture is possible according to the present embodiment, yield can be improved and it is possible to realize a cheaper product manufacture.

(Second Embodiment)

In the second embodiment, compared to the first embodiment described above, a SiO film or an amorphous silicon film 29 is formed between the first Si contained inorganic film 28 and the organic resin film 30.

Figure 5:
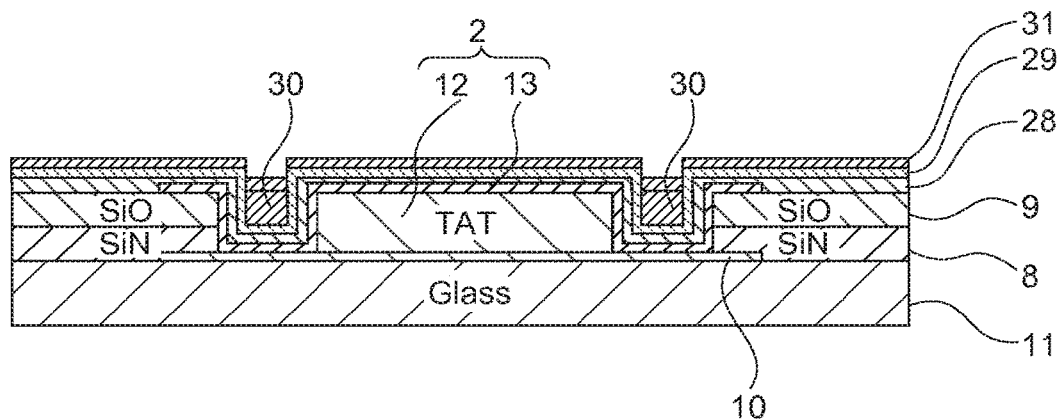
FIG. 5 is a partial expanded vertical cross-sectional diagram during a manufacturing process of a terminal region according to a second embodiment.

FIG. 5 shows the state where a stacked sealing film 27' is formed above the OLED display panel 100 in the second embodiment. Specifically, the stacked sealing film 27' is formed from a total of four layers, the first Si contained inorganic film 28, a SiO film or amorphous silicon film 29, the organic resin film 30 and the second Si contained inorganic film 31 in sequence from the side of the cathode 26. The SiO film or amorphous silicon film 29 is formed evenly on a surface of the first Si contained inorganic film 28 and also on an inner surface of the recess parts between the metal electrode 2 and the stacked film (the silicon nitride (SiN) layer 8 and silica (SiO) layer 9). Therefore, the organic resin film 30 agglomerates above the SiO film or amorphous silicon film 29 in the recess part.

Figure 6:
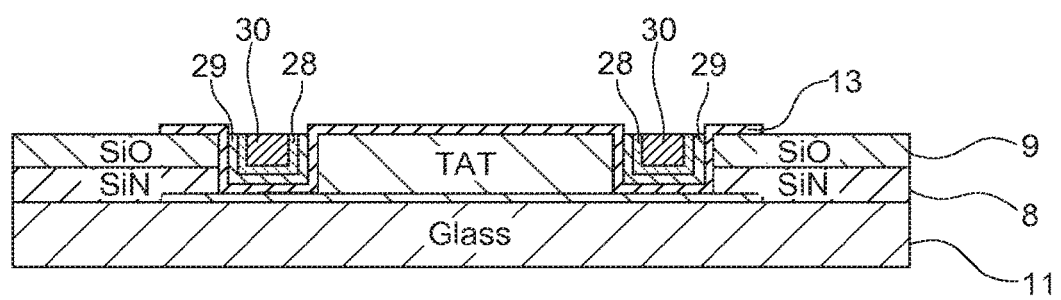
FIG. 6 is a partial expanded vertical cross-sectional diagram of a terminal region according to the second embodiment.

FIG. 6 shows the completed state of an OLED display panel with the surface of the metal electrode 2 exposed in the present embodiment. Dry etching is performed once on the first Si contained inorganic film 28, SiO film 29 and second Si contained inorganic film 31 while parts other than the terminal region 6 are masked in FIG. 5. In this way, the first Si contained inorganic film 28, SIO film or amorphous silicon film 29 and second Si contained inorganic film 31 formed above the metal electrode 2 and above the SiO layer 9 are removed, and the second Si contained inorganic film 31 formed above the organic resin film 30 is removed. In this completed state, the SiO film or amorphous silicon film 29 as well the organic resin film 30 and first Si contained inorganic film 28 remain in the recess parts between the metal electrode 2 and the stacked film (the silicon nitride (SiN) layer 8 and silica (SiO) layer 9).

Because the other structure and effects of the second embodiment are exactly the same as those in the first embodiment described above, their explanation is omitted.

(Modified Example)

In the embodiments described above, although an anode was used as reflection electrode and a cathode as a transparent electrode for forming what is called a top emission type OLED display panel, in the case of forming what is called a bottom emission type OLED display panel, an anode may be used as a transparent electrode and a cathode as a reflection electrode. In addition, it is possible to form a film in the order ITO/Ag/ITO as the structure of a reflection electrode and it is possible to use ITO or IZO (Indium Zinc Oxide) as a transparent electrode.

In addition, because what is called a top emission type OLED display panel is formed in the embodiments described above, an opposing substrate is arranged and a filler agent such as an epoxy resin is filled between the substrates. In this case, because it is possible to arrange a color filter on an inner surface of a sealing substrate, it is possible to make all of the emitted colors of the organic light emitting layer 25c of each OLED 15 white.

What is claimed is:

1. A manufacturing method of an OLED display panel comprising:
    forming a display part including a plurality of organic light emitting elements above a substrate;
    forming a plurality of electrodes in a band shape above the substrate, each capable of conducting with an electrode above another substrate;
    forming a recessed part between the electrodes above the substrate;
    forming a stacked sealing film including a first contained inorganic layer, an organic resin layer and a second contained inorganic layer in sequence from the substrate side above the display part and a terminal region which have the plurality of electrodes; and
    exposing a surface of the plurality of electrodes by performing etching using etching conditions suitable for the first Si contained inorganic layer and the second Si contained inorganic layer while the display part is masked.

* * * * *